United States Patent [19]
Bronner et al.

[11] Patent Number: 6,028,004
[45] Date of Patent: Feb. 22, 2000

[54] PROCESS FOR CONTROLLING THE HEIGHT OF A STUD INTERSECTING AN INTERCONNECT

[75] Inventors: Gary B. Bronner, Stormville, N.Y.; Jeffrey P. Gambino, Gaylordsville, Conn.

[73] Assignee: International Business Machines Corporation, Armonk, N.Y.

[21] Appl. No.: 09/003,101

[22] Filed: Jan. 6, 1998

[51] Int. Cl.[7] .................................................. H01L 21/44
[52] U.S. Cl. ........................ 438/657; 438/618; 438/631; 438/633; 438/652; 438/666; 438/669; 438/672; 438/700; 438/637
[58] Field of Search ...................................... 438/618, 631, 438/633, 637, 652, 657, 666, 669, 672, 700

[56] References Cited

U.S. PATENT DOCUMENTS

| | | | |
|---|---|---|---|
| 5,229,326 | 7/1993 | Dennison et al. | 437/195 |
| 5,244,534 | 9/1993 | Yu et al. | 156/636 |
| 5,244,837 | 9/1993 | Dennison | 437/195 |
| 5,262,354 | 11/1993 | Cote et al. | 437/195 |
| 5,286,675 | 2/1994 | Chen et al. | 437/195 |
| 5,338,700 | 8/1994 | Dennison et al. | 437/60 |
| 5,354,712 | 10/1994 | Ho et al. | 437/195 |
| 5,578,523 | 11/1996 | Fiordalice et al. | 437/190 |
| 5,612,254 | 3/1997 | Mu et al. | 437/195 |
| 5,635,423 | 6/1997 | Huang et al. | 437/195 |
| 5,658,830 | 8/1997 | Jeng | 438/620 |
| 5,716,883 | 2/1998 | Tseng | 438/253 |
| 5,904,563 | 5/1999 | Yu | 438/672 |
| 5,910,020 | 6/1999 | Yamada | 438/624 |

*Primary Examiner*—John F. Niebling
*Assistant Examiner*—David Zarneke
*Attorney, Agent, or Firm*—Pollock, Vande Sande & Amernick; Steven Capella

[57] ABSTRACT

Electrical interconnection with studs is formed by depositing conductive stud material in contact holes in a dielectric layer; patterning the conductive stud material and removing a shallow portion of the dielectric layer surrounding the stud material; depositing a thin layer of dielectric material over the conductive stud and first dielectric layer; forming a trench in the dielectric layers and over the top of the stud material; and depositing conductive material in the trench.

15 Claims, 2 Drawing Sheets

6,028,004

PROCESS FOR CONTROLLING THE HEIGHT OF A STUD INTERSECTING AN INTERCONNECT

TECHNICAL FIELD

The present invention is concerned with a method for forming an electrical interconnection with a stud and is especially concerned with controlling the height of the stud in the interconnection. The present invention is especially suitable for fabricating polycrystalline silicon (polysilicon) studs that intersect a damascene interconnect. The process of the present invention addresses the problem of having a high resistivity stud, such as a polycrystalline silicon, intersecting a low resistivity wire and of ensuring that low-resistance, electrical continuity exists across the wire. The present invention employs a shallow recess etch followed by depositing a relatively thin second insulating layer over the stud to ensure that the interconnect is continuous over the top of the stud.

BACKGROUND OF INVENTION

Conductive studs are widely used for electrically connecting metal layers of a semiconductor device to underlying conductive members such as diffusion regions, polysilicon layers, or other metal layers. Polysilicon studs are often used as contacts in silicon memory chips, because they can be fabricated with minimal damage to the silicon substrate, thereby minimizing problems associated with junction leakage. (See Bronner et al, VLSI Symp. Proc., 1995, p. 15). The interconnects used to connect these polysilicon studs are often formed by the "damascene" process (see Caanta et al, VMIC Proc., 1991, p. 144). A "damascene" process basically involves forming a trench in an insulating layer such as by etching and filling the trench with a conductive material such as a metal. This is followed by planarization typically achieved by chemical-mechanical polishing (CMP) whereby the metal on the substrate surface outside trench is removed. In contrast, the traditional etch back technique for forming metal wiring (e.g. for interconnects) involves applying a metal layer on a substrate surface, patterning the metal layer by etching (usually reactive ion etching) and filling in the spaces in the metal pattern with a dielectric material. The damascene process offers many advantages compared to the traditional etch back technique, including less erosion of the stud during the metal over-etch, which erosion in an extreme case can cause an open circuit between the metal interconnect and the stud.

Where the damascene process is used to form interconnects over studs, controlling the amount of stud recess during the stud patterning (prior to forming the interconnect trenches) is critical, in part because the damascene interconnect trench etch generally does not affect the stud height significantly. For instance, too little recess results in the studs completely intersecting the interconnect, and a high resistance for the interconnect. (See FIG. 1). On the other hand, too much recess can leave underlying structures such as the gate cap insulator, e.g. silicon nitride, unprotected during the interconnect trench etch, thereby causing high leakage between the interconnects and the gates. See FIG. 2.

From a practical manufacturing standpoint, difficulties exist in controlling the stud recess depth due to buried voids or seams in the polysilicon, which in turn results in very rapid recessing of the stud.

SUMMARY OF INVENTION

It is therefore an object of the present invention to provide for controlled recess of a stud for a damascene process. It is a further object of the invention to provide an improved damascene process for forming interconnects which intersect conductive studs. The present invention overcomes the problems of poorly controlled recess depth as experienced in the prior art.

In one aspect of the present invention, a short or shallow dielectric recess etch is employed for minimizing the opening of voids, followed by depositing a relatively thin second insulating layer to ensure that the interconnect is continuous over the top of the stud. The second insulating layer thickness is less than the depth of the interconnect trench.

More especially, the present invention is concerned with methods of forming electrical interconnection with studs which methods comprise depositing conductive stud material within contact holes in a first dielectric layer and over the first dielectric layer. The conductive stud material is patterned by removing conductive stud material from over the first dielectric layer and over-etching into the first dielectric layer, thereby removing a shallow thickness of the first dielectric layer, creating a recess below the height of the remaining conductive stud material within the contact hole. A relatively thin second layer of dielectric material is deposited over the conductive stud and first dielectric (insulating) layer.

A trench is formed in the dielectric layers and over the conductive stud. The depth of the trench is greater than the thickness of the second dielectric (insulating) layer. Conductive material is then deposited, followed by patterning to provide the conductive interconnects in the trench.

As can be appreciated from the above, the present invention provides for a controlled recess of the stud with respect to the top of the interconnect which recess primarily depends upon the thickness of the second insulating layer. The methods of the invention are more controllable than prior art techniques and ensure that the appropriate electrical contact between a stud and the overlying interconnect.

These and other objects and advantages of the present invention will become readily apparent from the following detailed description.

BEST AND VARIOUS MODES FOR CARRYING OUT INVENTION

Figure 1:
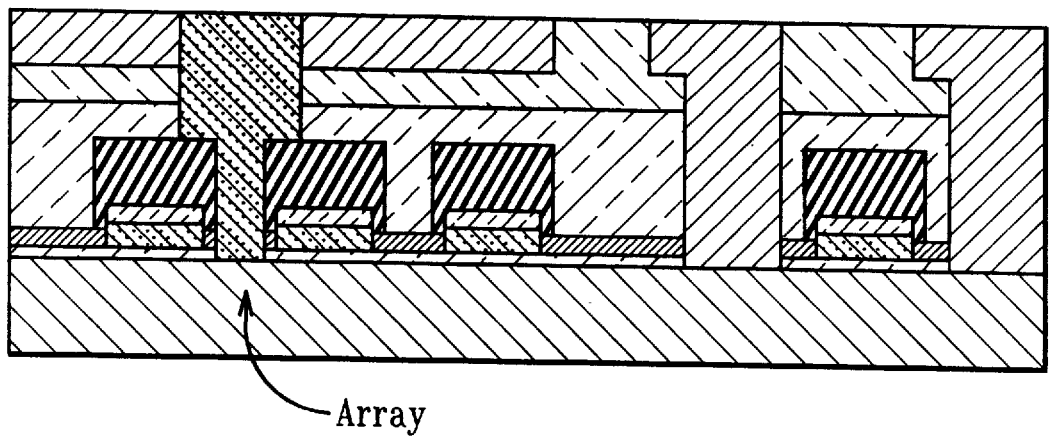
FIG. 1 illustrates prior art problems when too little stud recess occurs.
Figure 2:
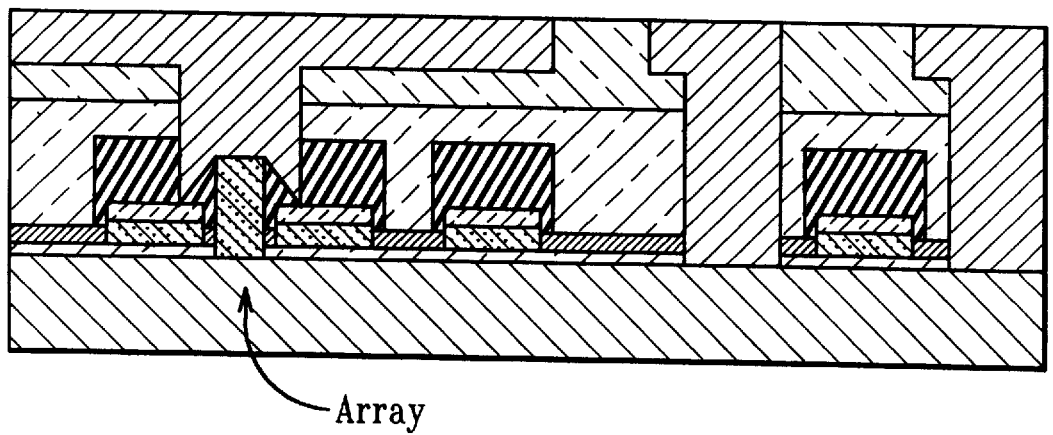
FIG. 2 illustrates prior art problems that can occur when the stud recess is too large.
Figure 3:
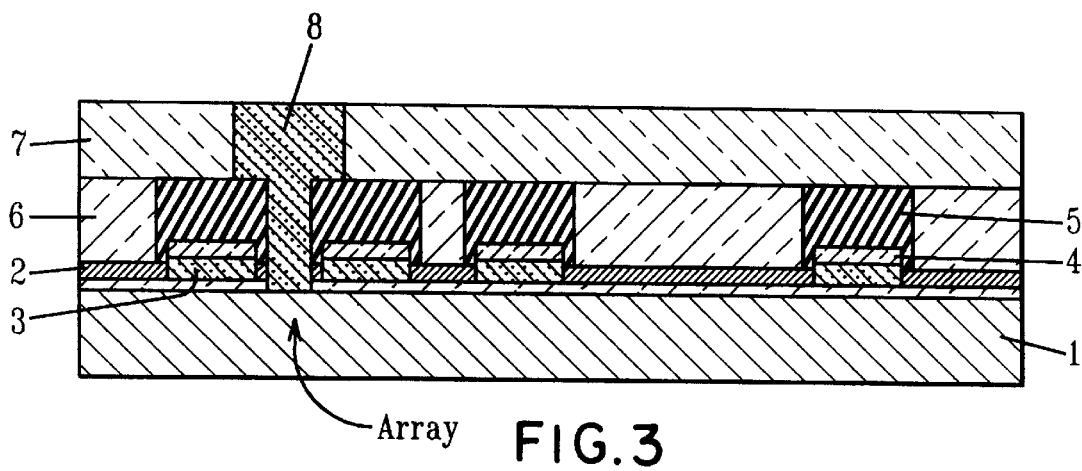
FIGS. 3–5 are schematic diagrams of a structure in various stages of fabrication according to a process of the present invention.
Figure 4:
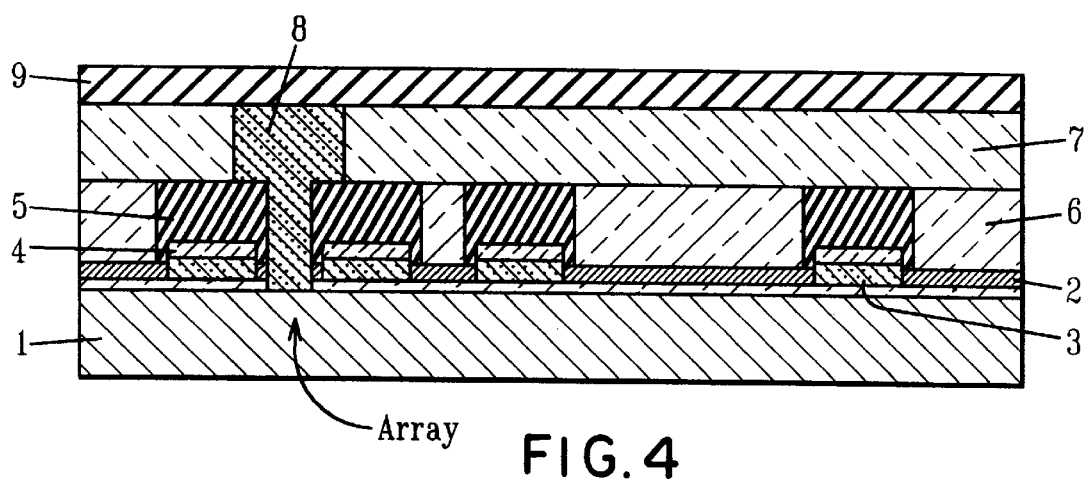
Figure 5:
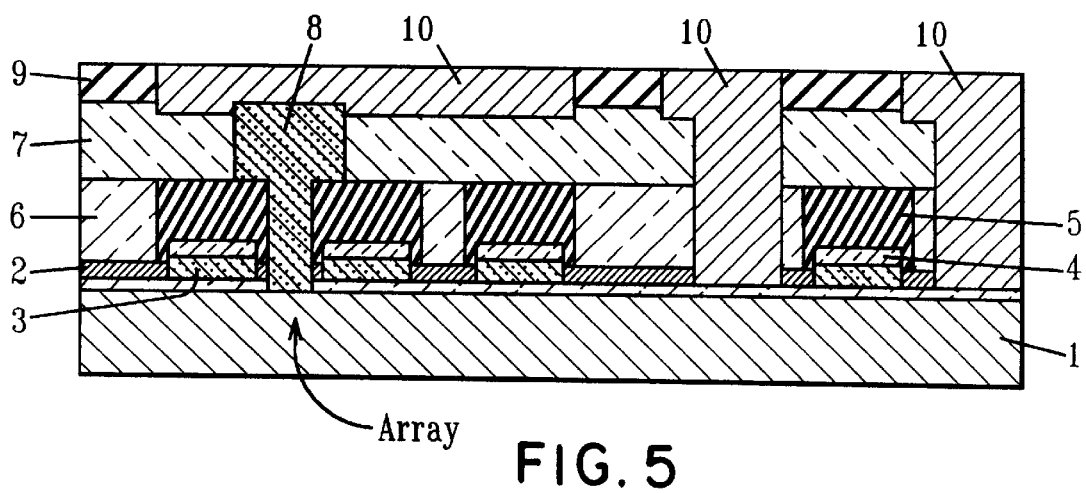

In order to facilitate an understanding of the present invention, reference will be made to FIGS. 3–5 which illustrate a diagrammatic representation of the steps of an embodiment the present invention.

The methods of the invention are not limited to the construction of any specific device or circuit design.

In a typical device, such as dynamic random access memory (DRAM) device, various components such as trench capacitors, insulation and junctions (not shown) are provided on a semiconductor substrate 1 (e.g., a silicon substrate). The device may contain word lines 2 which interconnect with gates. Gates may comprise, for example, polysilicon 3 capped with insulating layers such as silicon dioxide 4 and silicon nitride 5. A doped silicate glass 6 such as boron and phosphorus doped silicate glass (BPSG) can be deposited and planarized such as by chemical-mechanical polishing to the top of the word lines 2.

A dielectric insulating layer 7 is typically deposited for providing isolation between word lines and bit lines. The insulating layer 7 can be doped or undoped silicon dioxide, a particular example being silicon oxide formed by a TEOS (tetraethylorthosilicate)-ozone or TEOS-oxygen process. Typically, the silicon oxide film is about 50 to about 1000 nanometers thick, more typically about 150 to about 450 nanometers thick, a particular example being about 300 nanometers thick. The insulating layer 7 provides insulation between contact holes which may be fabricated through insulating layer 7 using conventional lithography and reactive ion etching.

Doped polysilicon (e.g. phosphorus or arsenic-doped) is typically deposited in the contact holes and over insulating layer 7. The polysilicon is then patterned (removed from the top of layer 7) by dry etching or chemical-mechanical polishing (CMP) to reveal polysilicon studs 8. In order to ensure that all of the polysilicon is removed from the top surface of the insulating layer 7, the etching or CMP is carried out so as to remove a shallow thickness of the insulating layer 7 surrounding stud 8. Typically, the over-etching or over-polishing removes about 5 to about 100 nanometers of layer 7, and preferably about 10 to about 50 nanometers. This minimal over-etching or over-polishing ensures that all polycrystalline silicon is removed in between the studs 8.

According to the present invention, a relatively thin layer 9 of a second dielectric (insulating) material such as silicon oxide from a TEOS-ozone or TEOS-oxygen deposition process is then provided. The second insulating layer 9 is preferably deposited over the first insulating layer 7 and over the top of the stud 8. The second insulating layer 9 is preferably about 50 to about 1000 nanometers thick, more preferably about 50 to about 400 nanometers thick, a specific example being about 100 nanometers thick. It is essential that the thickness of the second insulating layer be less than the depth of the subsequently created interconnect trench in order to ensure electrical continuity between the stud and the interconnect line. The trench for the interconnect level is then fabricated such as by lithography and reactive ion etching. The depth of the trench as illustrated in FIG. 5 must be greater than the thickness of the second insulating layer 9. The depth of the trench is preferably at least about 50 nanometers, more preferably at about 55 nanometers to 1100 nanometers.

If desired, contact holes 10 in support regions of the substrate can also be fabricated by lithography and reactive ion etching, using masking as may be appropriate. Since there is minimal recessing of the formed polysilicon stud 8, the underlying gates structures (or other features) are protected from the interconnect trench etch. Moreover, the insulating layer 9 on top of the stud 8 is preferably thin enough to ensure that the trench etch will uncover the entire top of the polysilicon stud 8.

Conductive material is then deposited in the trench and any contact holes formed (after formation of stud 8) as desired. The deposited conductive material then patterned such as by chemical-mechanical polishing. Examples of suitable conductive material 10 are tungsten and tungsten silicide. As shown, the conductive material forms an interconnect over the polysilicon stud 8.

If desired, additional metal layers (or other layers) can be formed depending upon the requirements of the particular semiconductor structure.

As demonstrated by the above, the recess of the stud with respect to the top of the interconnect depends primarily upon the thickness of the second insulating layer. Advantageously, the ability to control recess depth by the methods of the invention is much greater than in the prior art techniques.

As mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. Also, it is intended that the appended claims be construed to include alternative embodiments.

What is claimed is:

1. A method for forming electrical interconnection with studs which comprises:

depositing conductive stud material within contact holes in a first dielectric layer and over said first dielectric layer;

patterning the conductive stud material to form conductive studs by removing conductive stud material from over said first dielectric layer and by removing a shallow portion of said first dielectric layer surrounding the conductive stud material in said contact holes;

depositing a second layer of dielectric material over said conductive studs and said first dielectric layer;

forming trench through said second dielectric layer and over the top of said conductive studs wherein the depth of the trench is greater than the thickness of the second dielectric layer;

depositing conductive material in said trench and patterning said conductive material to provide an electrical interconnection with said studs.

2. The method of claim 1 wherein said conductive stud material is doped polysilicon.

3. The method of claim 1 wherein said first and second dielectric layers comprise silicon dioxide.

4. The method of claim 3 wherein said silicon dioxide is obtained from a TEOS-ozone or TEOS-oxygen deposition technique.

5. The method of claim 1 wherein said second dielectric layer has a thickness of about 50 to 1000 nanometers.

6. The method of claim 5 wherein the thickness of said second dielectric layer is about 50 to about 400 nanometers.

7. The method of claim 1 wherein the first dielectric layer has a thickness of about 50 to 1000 nanometers.

8. The method of claim 7 wherein the thickness of the first dielectric layer is about 150 to about 450 nanometers.

9. The method of claim 1 wherein the shallow portion of said first dielectric layer removed is about 5 to 100 nanometers thick.

10. The method of claim 9 wherein the shallow potion is about 10 to 50 nanometers thick.

11. The method of claim 1 wherein the depth of said trench is about 50 to 1100 nanometers.

12. The method of claim 1 wherein the conductive material deposited in said trench is tungsten or tungsten silicide.

13. The method of claim 1 wherein said conductive stud material is removed from over said first dielectric layer by reactive ion etching.

14. The method of claim 1 wherein said conductive stud material is removed from over said first dielectric layer by chemical-mechanical polishing.

15. The method of claim 1 wherein said conductive stud material is phosphorus doped polysilicon.

* * * * *